United States Patent
Yang

(10) Patent No.: US 10,432,159 B2
(45) Date of Patent: Oct. 1, 2019

(54) SIGNAL AMPLIFYING SYSTEM IN A HALL DETECTING AND AMPLIFYING SYSTEM

(71) Applicant: Chengdu Monolithic Power Systems Co., Ltd., Chengdu (CN)

(72) Inventor: Zhijiang Yang, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 15/897,109

(22) Filed: Feb. 14, 2018

(65) Prior Publication Data

US 2018/0241365 A1    Aug. 23, 2018

(30) Foreign Application Priority Data

Feb. 22, 2017  (CN) .......................... 2017 1 0095539

(51) Int. Cl.
| | |
|---|---|
| H03F 15/00 | (2006.01) |
| H03F 9/04 | (2006.01) |
| G01R 33/00 | (2006.01) |
| H03F 3/345 | (2006.01) |
| H03F 3/45 | (2006.01) |
| G01R 33/07 | (2006.01) |

(52) U.S. Cl.
CPC ............... *H03F 9/04* (2013.01); *G01R 33/00* (2013.01); *G01R 33/0023* (2013.01); *G01R 33/072* (2013.01); *H03F 3/345* (2013.01); *H03F 3/45183* (2013.01); *H03F 15/00* (2013.01); *H03F 2200/261* (2013.01)

(58) Field of Classification Search
CPC ................ H03F 15/00; H03G 2201/60; H03G 2201/606; H03G 3/20; H03G 3/30
USPC ...................... 330/6, 137, 281, 141
See application file for complete search history.

(56) References Cited

U.S. PATENT DOCUMENTS 5,227,737 A * 7/1993 Sutliff ................... G11B 5/012
                                                             330/254

* cited by examiner

*Primary Examiner* — Steven J Mottola
(74) *Attorney, Agent, or Firm* — Perkins Coie LLP

(57) ABSTRACT

A signal amplifying system having an oscillator and an amplifying circuit. The oscillator has a first resistor with a first resistance R1 and a first capacitor with a first capacitance C1, and generates an oscillating signal having a frequency f which equals to k1/(R1*C1), k1 is a first proportional parameter. The amplifying circuit has an input terminal to receive an input signal and amplifies the input signal under the control of the oscillating signal. The amplifying circuit has a second resistor with a second resistance R2 and a second capacitor with a second capacitance C2. The amplifying circuit has a −3 dB bandwidth $W_{-3\ dB}$ which equals to k2/(R2*C2), k2 is a second proportional parameter. In this signal amplifying system, the product of the first resistance R1 and the first capacitance C1 is proportional to the product of the second resistance R2 and the second capacitance C2.

9 Claims, 4 Drawing Sheets

SIGNAL AMPLIFYING SYSTEM IN A HALL DETECTING AND AMPLIFYING SYSTEM

CROSS REFERENCE

This application claims the benefit of CN application No. 201710095539.3, filed on Feb. 22, 2017, and incorporated herein by reference.

FIELD

The invention generally relates to an electric circuit, more specifically but not exclusively, relates to an amplifying circuit.

BACKGROUND

An amplifying circuit is usually required to have a constant gain during the whole working temperature range in some applications, such as in a hall voltage amplifying circuit. For example, when a hall sensor is used to sense a current, the bandwidth of an amplifying circuit in the hall sensor is required to be very narrow to decrease the effect of white noise which exists in the whole bandwidth. For the gain of an amplifying circuit has a relationship with its bandwidth, the gain of the amplifying circuit will vary with the temperature. Now the method of trimming is usually adopted to keep the gain constant, which is very cumbersome and complicated.

In light of above description, an amplifying circuit having a constant gain during the whole working temperature range and a simple architecture is required to solve at least one of the above problems.

SUMMARY

An embodiment of the present invention discloses a signal amplifying system, which comprises an oscillator and an amplifying circuit. The oscillator comprises a first resistor with a first resistance R1 and a first capacitor with a first capacitance C1, the oscillator is configured to provide an oscillating signal having a frequency f, wherein f=k1/(R1*C1), where k1 is a first proportional parameter. The amplifying circuit is configured to receive the oscillating signal and an input signal, and is further configured to amplify the input signal under the control of the oscillating signal. The amplifying circuit comprises a bias circuit having a second resistor with a second resistance R2, and an amplifying potion having a second capacitor with a second capacitance C2, the amplifying circuit has a −3 dB bandwidth $W_{-3\ dB\_Amp}$, wherein $W_{-3\ dB\_Amp}$=k2/(R2*C2), where k2 is a second proportional parameter. Wherein the product of the first resistance R1 and the first capacitance C1 is proportional to the product of the second resistance R2 and the second capacitance C2.

An embodiment of the present invention discloses a hall detecting and amplifying system, which comprises a signal amplifying system, a first transistor, a second transistor, a third transistor, a fourth transistor, a fifth transistor, a sixth transistor, a seventh transistor, an eighth transistor and a hall sensor. The signal amplifying system comprises an oscillator and an amplifying circuit. The oscillator comprises a first resistor with a first resistance R1 and a first capacitor with a first capacitance C1, the oscillator is configured to provide an oscillating signal having a frequency f, wherein f=k1/(R1*C1), where k1 is a first proportional parameter. The amplifying circuit is configured to receive the oscillating signal and an input signal, and is further configured to amplify the input signal under the control of the oscillating signal. The amplifying circuit comprises a bias circuit having a second resistor with a second resistance R2, and an amplifying potion having a second capacitor with a second capacitance C2, the amplifying circuit has a −3 dB bandwidth $W_{-3\ dB\_Amp}$, wherein $W_{-3\ dB\_Amp}$=k2/(R2*C2), where k2 is a second proportional parameter. Wherein the product of the first resistance R1 and the first capacitance C1 is proportional to the product of the second resistance R2 and the second capacitance C2. The first transistor has a first terminal, a second terminal and a control terminal, wherein the first terminal is configured to receive a hall bias current, the control terminal is configured to receive the complementary signal of the oscillating signal. The second transistor has a first terminal, a second terminal and a control terminal, wherein the first terminal is configured to receive the hall bias current, the control terminal is configured to receive the oscillating signal. The third transistor has a first terminal, a second terminal and a control terminal, wherein the second terminal is coupled to a reference ground, the control terminal is configured to receive the complementary signal of the oscillating signal. The fourth transistor has a first terminal, a second terminal and a control terminal, wherein the second terminal is coupled to the reference ground, the control terminal is configured to receive the oscillating signal. The fifth transistor has a first terminal coupled to the input terminal of the amplifying circuit, a second terminal coupled to the second terminal of the second transistor, and a control terminal configured to receive the oscillating signal. The sixth transistor has a first terminal coupled to the input terminal of the amplifying circuit, a second terminal coupled to the second terminal of the first transistor, and a control terminal configured to receive the complementary signal of the oscillating signal. The seventh transistor has a first terminal coupled to the input terminal of the amplifying circuit, a second terminal coupled to the first terminal of the third transistor and a control terminal configured to receive the oscillating signal. The eighth transistor has a first terminal coupled to the input terminal of the amplifying circuit, a second terminal coupled to the first terminal of the fourth transistor, and a control terminal configured to receive the complementary signal of the oscillating signal. The hall sensor has a first contact coupled to the second terminal of the second transistor, a second contact coupled to the first terminal of the third transistor, a third contact coupled to the first terminal of the fourth transistor and a fourth contact coupled to the second terminal of the first transistor.

BRIEF DESCRIPTION OF THE DRAWINGS

The following detailed description of various embodiments of the present invention can best be understood when read in conjunction with the following drawings in which the features are not necessary drawn to scale but rather drawn as to best illustrate the pertinent features.

The use of the similar reference label in different drawings indicates the same of like components.

DETAILED DESCRIPTION

Various embodiments of the present invention will now be described. In the following description, some specific details, such as example circuits and example values for these circuit components, are included to provide a thorough understanding of embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the term "coupled" as used herein, is defined as directly or indirectly connected in an electrical or non-electrical manner. The terms "a", "an" and "the" include plural reference and the term "in" includes "in" and "on". The phrase "in one embodiment" as used herein does not necessarily refer to the same embodiment, although it may. The term "or" is an inclusive "or" operator, and is equivalent to the term "and/or" herein, unless the context clearly dictates otherwise. The term "based on" is not exclusive and allows for being based on additional factors not described, unless the context clearly dictates otherwise. The term "circuit" means at least either a single component or a multiplicity of components, either active and/or passive, that are coupled together to provide a desired function. The term "signal" means at least one current, voltage, charge, temperature, data, or other signal. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. Those skilled in the art should understand that the meanings of the terms identified above do not necessarily limit the terms, but merely provide illustrative examples for the terms.

Figure 1:
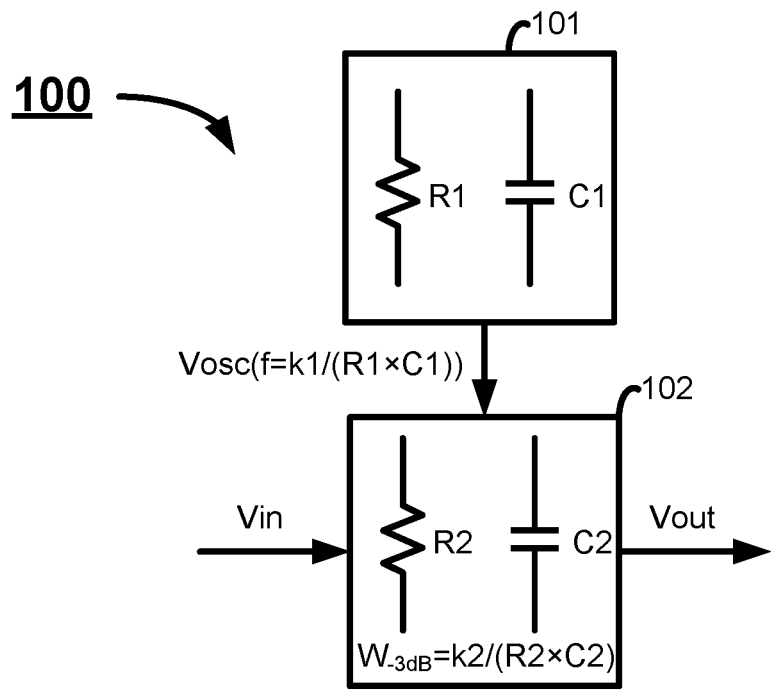
FIG. 1 illustrates a signal amplifying system 100 in accordance with an embodiment of the present invention.

FIG. 1 illustrates a signal amplifying system 100 in accordance with an embodiment of the present invention. The signal amplifying system 100 comprises an oscillator 101 and an amplifying circuit 102. The oscillator 101 comprises a first resistor R1 and a first capacitor C1. The amplifying circuit 102 comprises a second resistor R2 and a second capacitor C2. In the following description, labels R1, R2, C1 and C2 may represent the first resistor, the second resistor, the first capacitor and the second capacitor respectively, or represent the first resistance of the first resistor, the second resistance of the second resistor, the first capacitance of the first capacitor and the second capacitance of the second capacitor respectively depending on the specific situation. The oscillator 101 provides an oscillating signal $V_{OSC}$ having a frequency f, wherein f is illustrated as below:

$$f = k1/(R1*C1) \quad (1)$$

where k1 is a first proportional parameter.

In FIG. 1, the amplifying circuit 102 is coupled to the oscillator 101 to receive the oscillating signal $V_{OSC}$, and outputs an amplified signal Vout by amplifying an input signal Vin under the control of the oscillating signal $V_{OSC}$, the amplifying circuit 102 has a −3 dB bandwidth $W_{-3\ dB\_Amp}$, wherein $W_{-3\ dB\_Amp}$ is illustrated as below:

$$W_{-3\ dB\_Amp} = k2/(R2*C2) \quad (2)$$

where k2 is a second proportional parameter.

In the signal amplifying system 100 of FIG. 1, the product of the first resistance R1 and the first capacitance C1 is proportional to the product of the second resistance R2 and the second capacitance C2, which can be expressed as set forth in equation (3):

$$(R1*C1)/(R2*C2) = k3 \quad (3)$$

where k3 is a constant.

Suppose that the amplifying circuit 102 has a close-loop gain A0, it is easy for persons of ordinary skill in the amplifying circuit art to know the gain g of the amplifying circuit 102 can be calculated by equation (4):

$$g = A0 \times \left(1 - e^{\frac{-2 \times W_{-3\ dB}}{f}}\right) \quad (4)$$

Taking equations (1)-(3) into equation (4) and the gain g can be calculated by equation (5):

$$g = A0 \times \left(1 - e^{\frac{-2k2/(R2 \times C2)}{k1/(R1 \times C1)}}\right) = A0 \times \left(1 - e^{\frac{-2k2 \times k3}{k1}}\right) \quad (5)$$

It can be seen from equation (5), for the first proportional parameter k1, the second proportional parameter k2 and the third proportional parameter k3 are all constant, thus the gain g will be constant.

Figure 2:
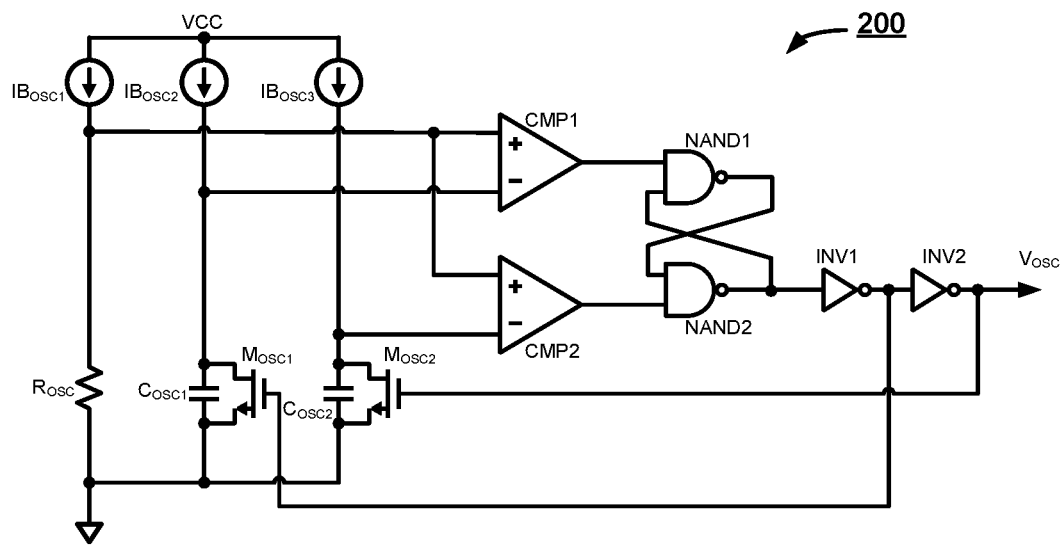
FIG. 2 illustrates an oscillator 200 used in the signal amplifying system 100 of FIG. 1 in accordance with an embodiment of the present invention.

FIG. 2 illustrates an oscillator 200 used in the signal amplifying system 100 of FIG. 1 in accordance with an embodiment of the present invention. In FIG. 2, the oscillator 200 comprises oscillating current sources $IB_{OSC1}$-$IB_{OSC3}$, an oscillating resistor $R_{OSC}$, a first oscillating capacitor $C_{OSC1}$, a second oscillating capacitor $C_{OSC2}$, a first oscillating transistor $M_{OSC1}$, a second oscillating transistor $M_{OSC2}$, a first comparator CMP1, a second comparator CMP2, a first NAND gate NAND1, a second NAND gate NAND2, a first inverter INV1 and a second inverter INV2. The oscillating resistor $R_{OSC}$ and the first oscillating current source $IB_{OSC1}$ are serially coupled between a power supply VCC and a reference ground GND. The first oscillating capacitor $C_{OSC1}$ and the second oscillating current source $IB_{OSC2}$ are also serially coupled between the power supply VCC and the reference ground GND. Furthermore, the first oscillating capacitor $C_{OSC1}$ is further coupled in parallel with the first oscillating transistor $M_{OSC1}$. The second oscillating capacitor $C_{OSC2}$ and the third oscillating current source $IB_{OSC3}$ are serially coupled between the power supply VCC and the reference ground GND, the second oscillating capacitor $C_{OSC2}$ is further coupled in parallel with the second oscillating transistor $M_{OSC2}$. The first comparator CMP1 has a first input terminal, a second input terminal and an output terminal, wherein the first input terminal is coupled to a common terminal of the oscillating resistor $R_{OSC}$ and the first oscillating current source $IB_{OSC1}$, the second input terminal is coupled to a common terminal of the first oscillating capacitor $C_{OSC1}$ and the second oscillating current source $IB_{OSC2}$. The second comparator CMP2 has a first input terminal, a second input terminal and an output terminal, wherein the first input terminal is coupled to a common terminal of the oscillating resistor $R_{OSC}$ and the first oscillating current source $IB_{OSC1}$, and the second input terminal is coupled to a common terminal of the second oscillating capacitor $C_{OSC2}$ and the third oscillating current source $IB_{OSC3}$. The first NAND gate NAND1 has a first input terminal, a second input terminal and an output terminal, wherein the first input terminal is coupled to the output terminal of the first comparator CMP1. The second NAND gate NAND2 has a first input terminal, a second input terminal and an output terminal, wherein the first input terminal is coupled to the output terminal of the second comparator CMP2, the second input terminal is coupled to the output terminal of the first NAND gate NAND1, and the output terminal is coupled to the second input terminal of the first NAND gate NAND1. The first inverter INV1 has an input terminal and an output terminal, wherein the input terminal is coupled to the output terminal of the second NAND gate NAND2 and the output terminal is configured to provide a control signal to control the switching actions of the first oscillating transistor $M_{OSC1}$. The second inverter INV2 has an input terminal and an output terminal, wherein the input terminal is coupled to the output terminal of the first inverter INV1 and the output terminal is configured to output an oscillating signal $V_{OSC}$ which are used to control the switching actions of the second oscillating transistor $M_{OSC2}$.

In the oscillator 200 of FIG. 2, each of the first oscillating capacitor $C_{OSC1}$ and the second oscillating capacitor $C_{OSC2}$ has a first capacitance C1, the oscillating resistor $R_{OSC}$ have a first resistance R1, each of the first oscillating current source $IB_{OSC1}$, the second oscillating current source $IB_{OSC2}$ and the third oscillating current source $IB_{OSC3}$ provides the same current value. The oscillating signal $V_{OSC}$ in FIG. 2 is a square wave having a frequency f. The equation (6) illustrates the relationship between the frequency f, the first resistance R1 and the first capacitance C1:

$$f = \frac{1}{2 \times R1 \times C1} \quad (6)$$

It can be seen from equation (6) that the oscillator 200 can generate the oscillating signal $V_{OSC}$ having the frequency defined by equation (1). In detail, the first proportional parameter k1 equals to ½ in the oscillator 200 of FIG. 2, thus the oscillator 200 of FIG. 2 can be used as the oscillator 101 of the signal amplifying system 100 shown in FIG. 1.

Persons of ordinary skill in the art should understand, although the first oscillating capacitor $C_{OSC1}$ and the second oscillating capacitor $C_{OSC2}$ in the above embodiment have the same capacitance, and the oscillating current sources $IB_{OSC1}$-$IB_{OSC3}$ have the same current value, in another embodiment, the first capacitor $C_{OSC1}$ and the second capacitor $C_{OSC2}$ may have different capacitance, and the oscillating current sources $IB_{OSC1}$-$IB_{OSC3}$ can have different current values as long as these values can satisfy equation (6).

Figure 3:
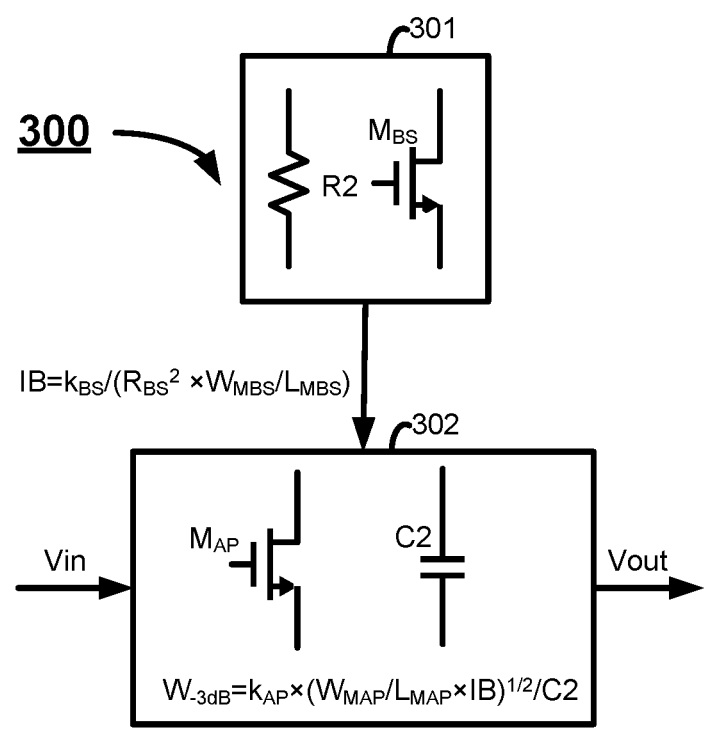
FIG. 3 illustrates an amplifying circuit 300 used in the signal amplifying system 100 of FIG. 1 in accordance with another embodiment of the present invention.

FIG. 3 illustrates an amplifying circuit 300 used in the signal amplifying system 100 of FIG. 1 in accordance with another embodiment of the present invention. In FIG. 3, the amplifying circuit 300 comprises a bias circuit 301 and an amplifying potion 302. The bias circuit 301 comprises a second resistor R2 and a bias transistor $M_{BS}$ having a gate width to length ratio $M_{BS}$ is $W_{MBS}/L_{MBS}$. The bias circuit 301 provides a bias current IB. The equation (7) illustrates the relationship between bias current IB, the gate width to length ratio of the bias transistor $M_{BS}$ and the resistance R2 of the second resistor:

$$IB = \frac{k_{BS}}{R2^2 \times \frac{W_{MBS}}{L_{MBS}}} \quad (7)$$

where $K_{BS}$ is a bias proportional parameter.

The amplifying circuit 302 comprises a second capacitor C2 and an amplifying transistor $M_{AP}$ having a gate width to length ratio $W_{MAP}/L_{MAP}$, the gate width to length ratio of the amplifying transistor $M_{AP}$ is proportional to the gate width to length ratio of the bias transistor $M_{BS}$, which can be expressed as set forth in equation (8):

$$\frac{W_{MAP}}{L_{MAP}} / \frac{W_{MBS}}{L_{MBS}} = k_{AB} \quad (8)$$

where $W_{MAP}/L_{MAP}$, is the gate width to length ratio of the amplifying transistor $M_{AP}$, and $W_{MBS}/L_{MBS}$ is the gate width to length ratio of the bias transistor $M_{BS}$.

The amplifying potion 302 is coupled to the bias circuit 301 to receive the bias current IB and outputs an amplified signal Vout by amplifying a received input signal Vin, wherein the amplifying potion 302 has a −3 dB bandwidth $W_{-3\ dB\_Potion}$ which is defined as below:

$$W_{-3dB\_Potion} = \frac{k_{AP} \times \sqrt{\frac{W_{MAP}}{L_{MAP}} \times IB}}{C2} \quad (9)$$

where $k_{AP}$ is an amplifying proportional parameter.

Taking equations (7) and (8) into equation (9) and $W_{-3\ dB\_Potion}$ can be rewritten as below:

$$W_{-3dB\_Potion} = \frac{k_{AP} \times \sqrt{k_{BS}} \times \sqrt{k_{AB}}}{R2 \times C2} \quad (10)$$

It can be seem from equation (10) that the amplifying circuit 300 of FIG. 3 can generate a −3 dB bandwidth having the same form described in equation (2), where k2 equals to $k_{AP} \times \sqrt{k_{BS}} \times \sqrt{k_{AB}}$, thus the amplifying circuit 300 of FIG. 3 can be used as the amplifying circuit 102 of the signal amplifying circuit 100 shown FIG. 1.

Figure 4:
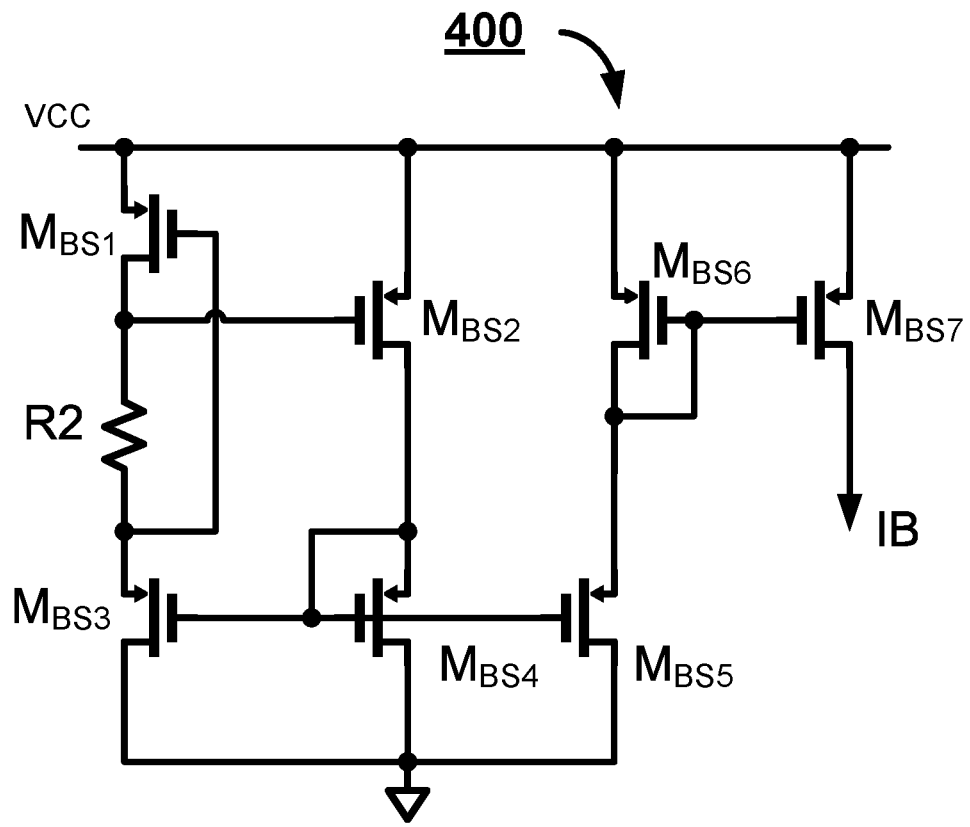
FIG. 4 illustrates a bias circuit 400 used in the amplifying circuit 300 of FIG. 3 in accordance with an embodiment of the present invention.

FIG. 4 illustrates a bias circuit 400 used in the amplifying circuit 300 in accordance with an embodiment of the present invention. As shown in FIG. 4, the bias circuit 400 comprises bias transistors $M_{BS1}$-$M_{BS7}$ and a second resistor R2. Each of bias transistors $M_{BS1}$-$M_{BS7}$ has a first terminal, a second terminal and a control terminal. The second resistor R2 has a first terminal and a second terminal. The first terminal of the first bias transistor $M_{BS1}$ is coupled to a power supply VCC, the second terminal of the first bias transistor $M_{BS1}$ is coupled to the first terminal of the second resistor R2 and the control terminal of the first bias transistor $M_{BS1}$ is coupled to the second terminal of the second resistor R2. The first terminal of the second bias transistor $M_{BS2}$ is coupled to the power supply VCC, the control terminal of the second bias transistor $M_{BS2}$ is coupled to the second terminal of the first bias transistor $M_{BS1}$. The first terminal of the third bias transistor $M_{BS3}$ is coupled to the second terminal of the second resistor R2, the second terminal of the third bias transistor $M_{BS3}$ is coupled to a reference ground GND, the first terminal of the fourth bias transistor $M_{BS4}$ is coupled to the second terminal of the second bias transistor $M_{BS2}$, the second terminal of the fourth bias transistor $M_{BS4}$ is coupled to the reference ground GND. The control terminal of the fourth bias transistor $M_{BS4}$ is coupled to the control terminal of the third bias transistor $M_{BS3}$ and the first terminal of the fourth bias transistor $M_{BS4}$. The control terminal of the fifth bias transistor $M_{BS5}$ is also coupled to the control terminal of the third bias transistor $M_{BS3}$, the second terminal of the fifth bias transistor $M_{BS5}$ is coupled to the reference ground GND. The first terminal of the sixth bias transistor $M_{BS6}$ is coupled to the power supply VCC, the second terminal of the sixth bias transistor $M_{BS6}$ is coupled to the first terminal of the fifth bias transistor $M_{BS5}$ and the control terminal of the sixth bias transistor $M_{BS6}$. The first terminal of the seventh bias transistor $M_{BS7}$ is coupled to the power supply VCC, the control terminal of the seventh bias transistor $M_{BS7}$ is coupled to the control terminal of the sixth bias transistor $M_{BS6}$. The second terminal of the seventh bias transistor $M_{BS7}$ outputs a bias current IB.

In one embodiment, each of the first terminals of the bias transistors $M_{BS1}$-$M_{BS7}$ is source terminal, and each of the second terminals of the bias transistors $M_{BS1}$-$M_{BS7}$ is drain.

In one embodiment, the first bias transistor $M_{BS1}$ and the bias transistors $M_{BS3}$, $M_{BS4}$, $M_{BS5}$ and $M_{BS6}$ have the same size, thus they have the same gate width to length ratio $W_{MBS}/L_{MBS}$. The size of the second bias transistor $M_{BS2}$ is m1 times that of the first bias transistor $M_{BS1}$, while the size of seventh bias transistor $M_{BS7}$ is m2 times that of the sixth bias transistor $M_{BS6}$, so the bias current IB provided by the bias circuit 400 can be calculated by the following equation:

$$IB = \frac{2}{uC_{OX}\frac{W_{MBS}}{L_{MBS}}} \times \frac{1}{R2^2} \times \frac{m2}{m1} \quad (11)$$

Where u is the carrier mobility of the bias transistors, Cox is the gate oxide layer capacitance per unit area of the bias transistors, $W_{MBS}/L_{MBS}$ is the gate width to length ratio of the first bias transistor $M_{BS1}$, R2 is the resistance of the second resistor.

In one embodiment, m1 is 4, and m2 is 10, thus the bias current IB can be calculated by the following equation:

$$IB = \frac{2}{uC_{OX}\frac{W_{MBS}}{L_{MBS}}} \times \frac{1}{R2^2} \quad (12)$$

It can be seen from equation (12) that, the bias circuit 400 of FIG. 4 can generate a −3 dB bandwidth with the same form defined by equation (7), where $$k_{BS} = \frac{5}{uC_{OX}},$$

so the bias circuit 400 of FIG. 4 can be used as the bias circuit in the amplifying circuit 300 as FIG. 3 shown.

Figure 5:
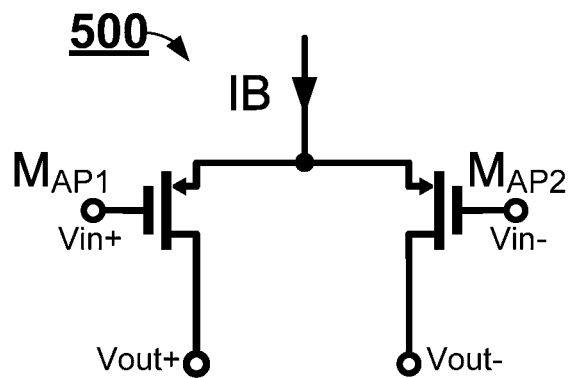
FIG. 5 illustrates an amplifying potion 500 used in the amplifying circuit 300 of FIG. 3 in accordance with an embodiment of the present invention.

FIG. 5 illustrates an amplifying potion 500 used in the amplifying circuit 300 in accordance with an embodiment of the present invention. In FIG. 5, the amplifying potion 500 comprises a first amplifying transistor $M_{AP1}$ and a second amplifying transistor $M_{AP2}$. Each of the two amplifying transistors $M_{AP1}$ and $M_{AP2}$ has a first terminal, a second terminal and a control terminal. The first terminal of the first amplifying transistor $M_{AP1}$ and the first terminal of the second amplifying transistor $M_{AP2}$ are coupled together to receive the bias current IB, the control terminal of the first amplifying transistor $M_{AP1}$ receives a positive input signal vin+ and the second terminal of the second amplifying transistor $M_{AP2}$ receives a negative input signal vin−, while the second terminal of the first amplifying transistor $M_{AP1}$ outputs a positive output signal vout+ and the second terminal of the second amplifying transistor $M_{AP2}$ outputs a negative output signal vout−. In one embodiment, the first terminals of the first amplifying transistor $M_{AP1}$ and the second amplifying transistor $M_{AP2}$ are source, and the second terminals of the first amplifying transistor $M_{AP1}$ and the second amplifying transistor $M_{AP2}$ are drain.

In one embodiment, the first amplifying transistor $M_{AP1}$ and the second amplifying transistor $M_{AP2}$ have the same size and thus have the same gate width to length ratio $W_{MAP}/L_{MAP}$, the amplifying gain gm of the amplifying potion 500 of FIG. 5 can be calculated by the following equation:

$$gm = \sqrt{2uC_{OX}\frac{W_{MAP}}{L_{MAP}} \times \frac{IB}{2}} \quad (13)$$

It is easy for persons of ordinary skill in this art to know that the amplifying potion 500 has a −3 dB bandwidth $W_{-3\ dB}$ illustrated as below:

$$W_{-3dB\_500} = \frac{gm}{C2} \quad (14)$$

where C2 is the capacitance of the second capacitor. It should be noted that, the amplifying potion 500 of FIG. 5 only illustrates the input stage, the second capacitor C2 which is a miler compensation capacitor located in the output stage (not shown in FIG. 5) of the amplifying potion 500 is not shown for simplify.

Taking equation (13) into equation (14), the −3 dB bandwidth $W_{-3\ dB\_500}$ can be calculated by an equation (16) illustrated as below:

$$W_{-3dB\_500} = \frac{gm}{C2} = \sqrt{uC_{OX}\frac{W_{MAP}}{L_{MAP}} \times IB} \bigg/ C2 \quad (15)$$

It can be seen from equation (15) that the amplifying potion 500 of FIG. 5 can generate a −3 dB bandwidth $W_{-3\ dB}$ having the same form defined in equation (9), wherein $K_{AP}$ equals to $\sqrt{uC_{OX}}$, thus the amplifying potion 500 can be used as the amplifying potion of the amplifying circuit 300 shown in FIG. 3.

The bias circuit 400 and the amplifying potion 500 are coupled together to form an amplifying circuit, which can be further coupled to the oscillator 200 in FIG. 2 to form a signal amplifying system. Taking equation (12) into equation (15), the −3 dB bandwidth $W_{-3\ dB}$ can be calculated from an equation illustrated as below:

$$W_{-3dB\_500} = \frac{gm}{C2} = \sqrt{uC_{OX}\frac{W_{MAP}}{L_{MAP}} \times \frac{5}{uC_{OX}\frac{W_{MBS}}{L_{MBS}}} \times \frac{1}{R2^2}} \Big/ C2 \quad (16)$$

If $\frac{W_{MAP}}{L_{MAP}} \Big/ \frac{W_{MBS}}{L_{MBS}}$ equals 8, then $$W_{-3dB\_500} = \frac{6.32}{R2 \times C2} \quad (17)$$

Taking equations (6) and (17) into equation (4), the gain g of the signal amplifying system can be calculated by an equation shown as below based on the basic analogy circuit knowledge.

$$g = A0 \times \left(1 - e^{\left(-6.32 \times \frac{R1 \times C1}{R2 \times C2}\right)}\right) \quad (18)$$

Wherein (R1*C1)/(R2*C2) equals to k3 which is a constant, and thus the gain g is constant.

Figure 6:
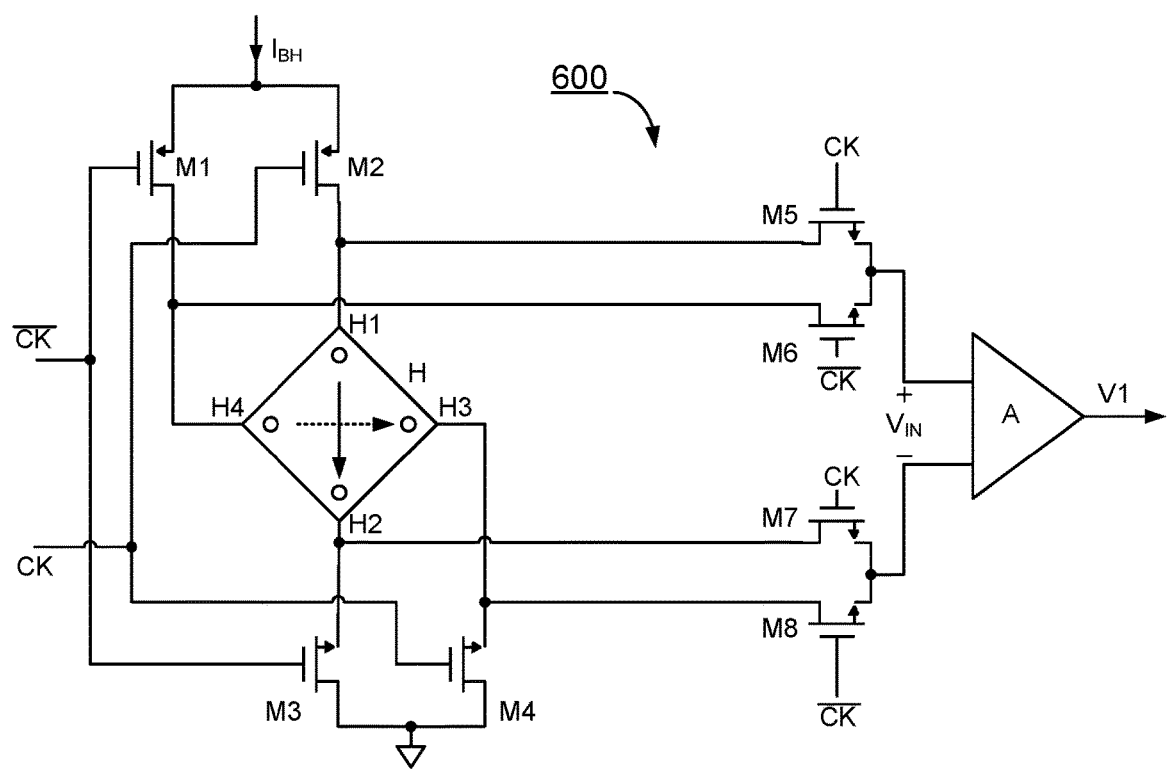
FIG. 6 illustrates a hall detecting and amplifying system 600 using the signal amplifying system 100 of FIG. 1 in accordance with an embodiment of the present invention.

FIG. 6 illustrates a hall detecting and amplifying system 600 using the signal amplifying system 100 of FIG. 1 in accordance with an embodiment of the present invention. In FIG. 6, the hall detecting and amplifying system 600 comprises transistors M1-M8, each of the transistors M1~M8 has a first terminal, a second terminal and a control terminal. The first terminals of the first transistor M1 and the second transistor M2 receive a hall bias current $I_{BH}$ to bias a hall sensor which will be described hereinafter. The second terminals of the third transistor M3 and the fourth transistor M4 are coupled to a reference ground GND. The second terminals of the fifth transistor M5 and the sixth transistor M6 are coupled to the second terminals of the first transistor M1 and the second transistor M2. The second terminals of the seventh transistor M7 and the eighth transistor M8 are coupled to the first terminals of the third transistor M3 and the fourth transistor M4. The control terminals of transistors M1, M3, M4 and M5 are coupled to the oscillator 101 shown in FIG. 1 to receive a complementary signal of the oscillating signal while the control terminals of transistors M2, M4, M6 and M8 are coupled to the oscillator 101 to receive the oscillating signal. The oscillator 101 is not shown in FIG. 6 for the sake of better description. In FIG. 6, the oscillating signal generated by the oscillator 101 is labeled as CK, while the complementary signal is labeled as $\overline{CK}=1$. In one embodiment, the first terminals of the transistors M1-M8 are source while the second terminals of the transistors M1-M8 are drain. In one embodiment, transistors M1 and M2 are P type while transistors M3-M8 are N type.

As shown in FIG. 6, the hall detecting and amplifying system 600 further comprises the hall sensor H having four contacts H1-H4, wherein a first contact H1 is coupled to the second terminal of the second transistor M2, a second contact H2 is coupled to the first terminal of the third transistor M3, a third contact H3 is coupled to the first terminal of the fourth transistor M4, a fourth contact H4 is coupled to second terminal of the first transistor M1. The hall detecting and amplifying system 600 further comprises an amplifying circuit A which has been specifically shown in FIG. 1. The amplifying circuit A has a first input terminal, a second input terminal and an output terminal, wherein the first input terminal of the amplifying circuit A is coupled to the first terminals of the transistors M5 and M6, the second input terminal of the amplifying circuit A is coupled to the first terminals of the transistors M7 and M8, and the output terminal of the amplifying circuit A provides an amplified signal V1 as an output signal of the hall detecting and amplifying system 600.

Still referring to FIG. 6, when oscillating signal CK is low, i.e., CK=0, $\overline{CK}=1$, transistors M2, M3, M6 and M8 are turned ON, transistors M1, M4, M5 and M7 are turned OFF, so the first contact H1 and the second contact H2 of the hall sensor H receive the hall bias current $I_{BH}$, the third contact H3 and the fourth contact H4 are coupled to the two input terminals of the amplifying circuit A respectively, thus an input voltage of the amplifying circuit A can be calculated by an equation illustrated as below:

$$V_{IN} = V_H + V_{OFFSET} \quad (19)$$

where $V_H$ is a hall voltage which is proportional to the magnetic flux density of the hall sensor H, the sensitivity of a hall plate and the bias current $I_{BH}$ added to the hall plate, $V_{OFFSET}$ is determined by the offset of the hall plate, the 1/f noise of the hall plate, and the offset voltage of the amplifying circuit A.

When oscillating signal CK is high, i.e., CK=1, $\overline{CK}=0$, transistors M2, M3, M6 and M8 are turned OFF, transistors M1, M4, M5 and M7 are turned ON, thus the third contact H3 and the fourth contact H4 of hall sensor H receive the hall bias current $I_{BH}$, the first contact H1 and the second contact H2 are coupled to the two input terminals of the amplifying circuit A, the input voltage of the amplifying circuit A can be calculated by an equation illustrated as below:

$$V_{IN} = -V_H + V_{OFFSET} \quad (20)$$

it can be seen from equations (19) and (20) that the hall voltage $V_H$ is effectively modulated.

The amplifying gain of the hall detecting and amplifying system 600 is constant by using the signal amplifying system 100 shown in FIG. 1, thus the bandwidth of the hall detecting and amplifying system 600 can be designed to be very narrow to decrease the effect of the white noise.

It will be appreciated by persons skilled in the art that the present invention is not limited to what has been particularly shown and described herein above. Rather the scope of the present invention is defined by the claims and includes both combinations and sub-combinations of the various features described herein above as well as variation and modifications thereof which would occur to persons skilled in the art upon reading the foregoing description and which are not in the prior art.

What is claimed is:

1. A signal amplifying system, comprising:
   an oscillator, comprising a first resistor with a first resistance R1 and a first capacitor with a first capacitance C1, the oscillator is configured to provide an oscillating signal having a frequency f, wherein f=k1/(R1*C1), where k1 is a first proportional parameter; and
   an amplifying circuit configured to receive the oscillating signal and an input signal, and further configured to amplify the input signal under the control of the oscillating signal, the amplifying circuit comprises a bias circuit having a second resistor with a second resistance R2, and an amplifying potion having a second capacitor with a second capacitance C2, the amplifying circuit has a −3 dB bandwidth $W_{-3\ dB\_Amp}$, wherein $W_{-3\ dB\_Amp}=k2/(R2*C2)$, where k2 is a second proportional parameter;

wherein the bias circuit further comprises a first bias transistor having a first gate width to length ratio $W_{MBS}/L_{MBS}$, the bias circuit is configured to provide a bias current IB, wherein $IB=k_{BS}/(R2^2 \times W_{MBS}/L_{MBS})$, where $k_{BS}$ is a third proportional parameter; and wherein the amplifying potion is configured to receive the bias current IB, and is further configured to amplify the input signal of the amplifying circuit under the control of the bias current IB, the amplifying potion further comprises a first amplifying transistor having a second gate width to length ratio $W_{MAP}/L_{MAP}$ the amplifying potion has a −3 dB bandwidth $W_{-3\ dB\_Potion}$, wherein $$W_{-3dB\_Potion} = \frac{k_{AP} \times \sqrt{\frac{W_{MAP}}{L_{MAP}} \times IB}}{C2},$$

where $k_{AP}$ is a fourth proportional parameter, wherein the second gate width to length ratio $W_{MAP}/L_{MAP}$ is proportional to the first gate width to length ratio $W_{MBS}/L_{MBS}$;

wherein the product of the first resistance R1 and the first capacitance C1 is proportional to the product of the second resistance R2 and the second capacitance C2.

2. The signal amplifying system of claim 1, wherein the first bias transistor has a first terminal, a second terminal and a control terminal, the first terminal of the first bias transistor is coupled to a power supply, and wherein the second resistor has a first terminal coupled to the second terminal of the first bias transistor, and a second terminal coupled to the control terminal of the first bias transistor; and wherein the bias circuit further comprises:

a second bias transistor having a first terminal, a second terminal and a control terminal, wherein the first terminal is coupled to the power supply, the control terminal is coupled to the second terminal of the first bias transistor;

a third bias transistor having a first terminal, a second terminal and a control terminal, wherein the first terminal is coupled to the second terminal of the second resistor, the second terminal is coupled to a reference ground;

a fourth bias transistor having a first terminal coupled to the second terminal of the second bias transistor, a second terminal coupled to the reference ground, and a control terminal coupled to the control terminal of the third bias transistor and the first terminal of the fourth bias transistor;

a fifth bias transistor having a first terminal, a second terminal and a control terminal, wherein the second terminal is coupled to the reference ground, and the control terminal is coupled to the control terminal of the fourth bias transistor;

a sixth bias transistor having a first terminal coupled to the power supply, a second terminal coupled to the first terminal of the fifth bias transistor, and a control terminal coupled to the second terminal of the sixth bias transistor; and a seventh bias transistor having a first terminal coupled to the power supply, a control terminal coupled to the control terminal of the sixth bias transistor, and a second terminal configured to provide the bias current IB;

wherein the first, third, fourth, fifth and sixth bias transistors have the same gate width to length ratio, the gate width to length ratios of the second and seventh bias transistors are proportional to the gate width to length ratio of the first bias transistor.

3. The signal amplifying system of claim 1, wherein the amplifying potion further comprises a second amplifying transistor, each of the first and the second amplifying transistors has a first terminal, a second terminal and a control terminal, wherein each first terminal of the first and second amplifying transistors is configured to receive the bias current IB, the control terminals of the first and second amplifying transistors are configured to receive the input signal, the second terminals of the first and second amplifying transistor are configured to provide an amplified signal, wherein the first and second amplifying transistors have the same gate width to length ratio.

4. The signal amplifying system of claim 1, wherein the oscillator further comprises:

a first current source having a first terminal coupled to a power supply, and a second terminal configured to provide a first current;

a second current source having a first terminal coupled to the power supply and a second terminal configured to provide a second current;

a third current source having a first terminal coupled to the power supply and a second terminal configured to provide a third current, wherein the first, second and third current have the same value;

an oscillating capacitor having a first terminal coupled to the second terminal of the third current source, and an second terminal coupled to a reference ground, wherein the oscillating capacitor has the first capacitance C1;

a first oscillating transistor having a first terminal, a second terminal and a control terminal, wherein the first terminal is coupled to the second terminal of the second current source, the second terminal is coupled to the reference ground;

a second oscillating transistor having a first terminal, a second terminal and a control terminal, wherein the first terminal is coupled to the second terminal of the third current source, and the second terminal is coupled to the reference ground;

a first comparator having a first input terminal coupled to the second terminal of the first current source, and a second input terminal coupled to the second terminal of the second current source;

a second comparator having a first input terminal coupled to the second terminal of the first current source, and a second input terminal coupled to the second terminal of the third current source;

a first NAND gate having a first input terminal and an output terminal, wherein the first input terminal is coupled to the output terminal of the first comparator;

a second NAND gate having a first input terminal coupled to the output terminal of the second comparator, a second input terminal coupled to the output terminal of the first NAND gate, and an output terminal coupled to the second input terminal of the first NAND gate;

a first inverter having an input terminal coupled to the output terminal of the second NAND gate, and an output terminal coupled to the control terminal of the first oscillating transistor; and a second inverter having an input terminal coupled to the output terminal of the first inverter, and an output terminal coupled to the control terminal of the second oscillating transistor to provide the oscillating signal;

wherein the first resistor has a first terminal coupled to the second terminal of the first current source, and a second terminal coupled to the reference ground;

and wherein the first capacitor has a first terminal coupled to the second terminal of the second current source, and a second terminal coupled to the reference ground.

5. A hall detecting and amplifying system, comprising:
a signal amplifying system, comprising:
1) an oscillator, comprising a first resistor with a first resistance R1 and a first capacitor with a first capacitance C1, the oscillator is configured to provide an oscillating signal having a frequency f, wherein f=k1/(R1*C1), where k1 is a first proportional parameter; and
2) an amplifying circuit configured to receive the oscillating signal and an input signal, and further configured to amplify the input signal under the control of the oscillating signal, the amplifying circuit comprises a bias circuit having a second resistor with a second resistance R2, and an amplifying potion having a second capacitor with a second capacitance C2, the amplifying circuit has a −3 dB bandwidth $W_{-3\ dB\_Amp}$, wherein $W_{-3\ dB\_Amp}$=k2/(R2*C2), where k2 is a second proportional parameter;

wherein the product of the first resistance R1 and the first capacitance C1 is proportional to the product of the second resistance R2 and the second capacitance C2;

a first transistor having a first terminal, a second terminal and a control terminal, wherein the first terminal is configured to receive a hall bias current, the control terminal is configured to receive the complementary signal of the oscillating signal;

a second transistor having a first terminal, a second terminal and a control terminal, wherein the first terminal is configured to receive the hall bias current, the control terminal is configured to receive the oscillating signal;

a third transistor having a first terminal, a second terminal and a control terminal, wherein the second terminal is coupled to a reference ground, the control terminal is configured to receive the complementary signal of the oscillating signal;

a fourth transistor having a first terminal, a second terminal and a control terminal, wherein the second terminal is coupled to the reference ground, the control terminal is configured to receive the oscillating signal;

a fifth transistor having a first terminal coupled to the input terminal of the amplifying circuit, a second terminal coupled to the second terminal of the second transistor, and a control terminal configured to receive the oscillating signal;

a sixth transistor having a first terminal coupled to the input terminal of the amplifying circuit, a second terminal coupled to the second terminal of the first transistor, and a control terminal configured to receive the complementary signal of the oscillating signal;

a seventh transistor having a first terminal coupled to the input terminal of the amplifying circuit, a second terminal coupled to the first terminal of the third transistor and a control terminal configured to receive the oscillating signal;

an eighth transistor having a first terminal coupled to the input terminal of the amplifying circuit, a second terminal coupled to the first terminal of the fourth transistor, and a control terminal configured to receive the complementary signal of the oscillating signal; and a hall sensor having a first contact coupled to the second terminal of the second transistor, a second contact coupled to the first terminal of the third transistor, a third contact coupled to the first terminal of the fourth transistor and a fourth contact coupled to the second terminal of the first transistor.

6. The hall detecting and amplifying system of claim 5, wherein the bias circuit further comprises a first bias transistor having a first gate width to length ratio $W_{MBS}/L_{MBS}$, the bias circuit is configured to provide a bias current IB, wherein IB=$k_{BS}$/(R2$^2$×$W_{MBS}/L_{MBS}$), where $k_{BS}$ is a third proportional parameter; and wherein the amplifying potion is configured to receive the bias current IB, and is further configured to amplify the input signal of the amplifying circuit under the control of the bias current IB, the amplifying potion further comprises a first amplifying transistor having a second gate width to length ratio $W_{MAP}/L_{MAP}$, the amplifying potion has a −3 dB bandwidth $W_{-3\ dB\_Potion}$, wherein $$W_{-3dB\_Potion} = \frac{k_{AP} \times \sqrt{\frac{W_{MAP}}{L_{MAP}} \times IB}}{C2},$$

where $k_{AP}$ is a fourth proportional parameter;
wherein the second gate width to length ratio $W_{MAP}/L_{MAP}$ is proportional to the first gate width to length ratio $W_{MBS}/L_{MBS}$.

7. The hall detecting and amplifying system of claim 6, wherein the first bias transistor has a first terminal, a second terminal and a control terminal, the first terminal of the first bias transistor is coupled to a power supply, and wherein the second resistor has a first terminal coupled to the second terminal of the first bias transistor, and a second terminal coupled to the control terminal of the first bias transistor; and
wherein the bias circuit further comprises:
a second bias transistor having a first terminal, a second terminal and a control terminal, wherein the first terminal is coupled to the power supply, the control terminal is coupled to the second terminal of the first bias transistor;
a third bias transistor having a first terminal, a second terminal and a control terminal, wherein the first terminal is coupled to the second terminal of the second resistor, the second terminal is coupled to the reference ground;
a fourth bias transistor having a first terminal coupled to the second terminal of the second bias transistor, a second terminal coupled to the reference ground, and a control terminal coupled to the control terminal of the third bias transistor and the first terminal of the fourth bias transistor;
a fifth bias transistor having a first terminal, a second terminal and a control terminal, wherein the second terminal is coupled to the reference ground, and the control terminal is coupled to the control terminal of the fourth bias transistor;

a sixth bias transistor having a first terminal coupled to the power supply, a second terminal coupled to the first terminal of the fifth bias transistor, and a control terminal coupled to the second terminal of the sixth bias transistor; and a seventh bias transistor having a first terminal coupled to the power supply, a control terminal coupled to the control terminal of the sixth bias transistor, and a second terminal configured to provide the bias current IB;

wherein the first, third, fourth, fifth and sixth bias transistors have the same gate width to length ratio, the gate width to length ratios of the second and seventh bias transistors are proportional to the gate width to length ratio of the first bias transistor.

8. The hall detecting and amplifying system of claim 6, wherein the amplifying potion further comprises a second amplifying transistor, each of the first and the second amplifying transistors has a first terminal, a second terminal and a control terminal, wherein each first terminal of the first and second amplifying transistors is configured to receive the bias current IB, the control terminals of the first and second amplifying transistors are configured to receive the input signal, the second terminals of the first and second amplifying transistor are configured to provide an amplified signal, wherein the first and second amplifying transistors have the same gate width to length ratio.

9. The hall detecting and amplifying system of claim 5, wherein the oscillator further comprises:

a first current source having a first terminal coupled to a power supply, and a second terminal configured to provide a first current;

a second current source having a first terminal coupled to the power supply and a second terminal configured to provide a second current;

a third current source having a first terminal coupled to the power supply and a second terminal configured to provide a third current, wherein the first, second and third current have the same value;

an oscillating capacitor having a first terminal coupled to the second terminal of the third current source, and an second terminal coupled to the reference ground, wherein the oscillating capacitor has the first capacitance C1;

a first oscillating transistor having a first terminal, a second terminal and a control terminal, wherein the first terminal is coupled to the second terminal of the second current source, the second terminal is coupled to the reference ground;

a second oscillating transistor having a first terminal, a second terminal and a control terminal, wherein the first terminal is coupled to the second terminal of the third current source, and the second terminal is coupled to the reference ground;

a first comparator having a first input terminal coupled to the second terminal of the first current source, and a second input terminal coupled to the second terminal of the second current source;

a second comparator having a first input terminal coupled to the second terminal of the first current source, and a second input terminal coupled to the second terminal of the third current source;

a first NAND gate having a first input terminal and an output terminal, wherein the first input terminal is coupled to the output terminal of the first comparator;

a second NAND gate having a first input terminal coupled to the output terminal of the second comparator, a second input terminal coupled to the output terminal of the first NAND gate, and an output terminal coupled to the second input terminal of the first NAND gate;

a first inverter having an input terminal coupled to the output terminal of the second NAND gate, and an output terminal coupled to the control terminal of the first oscillating transistor; and a second inverter having an input terminal coupled to the output terminal of the first inverter, and an output terminal coupled to the control terminal of the second oscillating transistor to provide the oscillating signal;

wherein the first resistor has a first terminal coupled to the second terminal of the first current source, and a second terminal coupled to the reference ground;

and wherein the first capacitor has a first terminal coupled to the second terminal of the second current source, and a second terminal coupled to the reference ground.

* * * * *